United States Patent
Ramdani et al.

[11] Patent Number: 5,832,017
[45] Date of Patent: Nov. 3, 1998

[54] RELIABLE NEAR IR VCSEL

[76] Inventors: Jamal Ramdani, 822 W. Devon Dr., Gilbert, Ariz. 85233; Wenbin Jiang, 4407 E. Gold Poppy Way, Phoenix, Ariz. 85044; Paul Claisse, 1806 W. Redfield Rd., Gilbert, Ariz. 85233

[21] Appl. No.: 616,419

[22] Filed: Mar. 15, 1996

[51] Int. Cl.$^6$ .............................. H01S 3/19; H01L 21/20

[52] U.S. Cl. .............................. 372/45; 372/96; 438/32; 438/38

[58] Field of Search .............................. 372/96, 45, 46; 438/22, 29, 46, 47, 32, 38

[56] References Cited

U.S. PATENT DOCUMENTS

| | | | |
|---|---|---|---|
| 5,212,704 | 5/1993 | Chen et al. | 372/45 |
| 5,432,809 | 7/1995 | Grodzinski et al. | 372/45 |
| 5,557,626 | 9/1996 | Gordzinski et al. | 372/45 |

*Primary Examiner*—James W. Davie

[57] ABSTRACT

A near IR VCSEL including a mirror stack positioned on a substrate, formed of a plurality of pairs of relatively high and low index of refraction layers a second mirror stack formed of a plurality of pairs of relatively high and low index of refraction layers, an active region sandwiched between the first stack and the second stack, the active region being formed of active layers of GaInAsP having barrier layers of GaAlAs sandwiched therebetween.

22 Claims, 1 Drawing Sheet

RELIABLE NEAR IR VCSEL

FIELD OF THE INVENTION

The present invention pertains to vertical cavity surface emitting lasers and more specifically to long lived, near IR vertical cavity surface emitting lasers and methods of fabrication.

BACKGROUND OF THE INVENTION

Near IR vertical cavity surface emitting laser diodes (VCSEL) are of great interest in optical communication applications. To obtain emissions of the appropriate wavelength, a GaAs material system is generally employed. In many cases, to obtain high reliability lasers, indium has been introduced in active layers. Along with indium, aluminum has been added to the active layer in order to maintain the near IR emission wavelength. However, the introduction of aluminum in the active region results in loss of lasing efficiency, since aluminum is highly reactive with oxygen, and oxygen behaves as a non-radiative recombination center in most III–V materials. The oxygen incorporation can occur either during the material growth or during device processing.

The reliability of a vertical cavity surface emitting laser is further reduced by the degradation of the active region. During continuous operation at room temperature, vertical cavity surface emitting lasers (VCSELs) often degrade rapidly causing a significant reduction in the lifetime of the device. It has been found that the rapid degradation is related to dark line defects in the electroluminescence topography of the active region. Dark line defects are caused by dislocations in the monocrystaline structure of the semiconductor material. Generally a dislocation in the substrate or stacking fault formed during crystal growth will undergo a climbing motion, forming a complicated dislocation network.

It would be highly advantageous, therefore, to remedy the foregoing and other deficiencies inherent in the prior art.

Accordingly, it is an object of the present invention to provide a VCSEL with an aluminum free active layer and containing indium.

Another object of the present invention is to provide a near IR VCSEL which has increased reliability and life time.

And another object of the present invention is to provide a near IR VCSEL with a reduced dark line defects density.

SUMMARY OF THE INVENTION

Briefly, to achieve the desired objects of the instant invention, in accordance with a preferred embodiment thereof, provided is a near IR vertical cavity surface emitting laser including a substrate, a first mirror stack of a first conductivity type positioned on the substrate, the first mirror stack being formed of a plurality of pairs of relatively high and low index of refraction layers, a second mirror stack of a second conductivity type, the second mirror stack being formed of a plurality of pairs of relatively high and low index of refraction layers, and an active region sandwiched between the first mirror stack and the second mirror stack, the active region being formed of a plurality of strained layers, the strained layers including an active layer being aluminum free and containing indium and phosphorous.

Further provided is a method of fabricating a near IR vertical cavity surface emitting laser including the steps of forming a first mirror stack of a first conductivity type, the first mirror stack being formed of a plurality of pairs of relatively high and low index of refraction layers, forming a first confining layer on the first mirror stack, forming an active region on the first confining layer, the active region being formed of a plurality of strained layers, the strained layers including an active layer being aluminum free and containing indium and phosphorous, forming a second confining layer on the active region, and forming a second mirror stack of a second conductivity type on the second confining layer, the second mirror stack being formed of a plurality of pairs of relatively high and low index of refraction layers.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENTS

Figure 1:
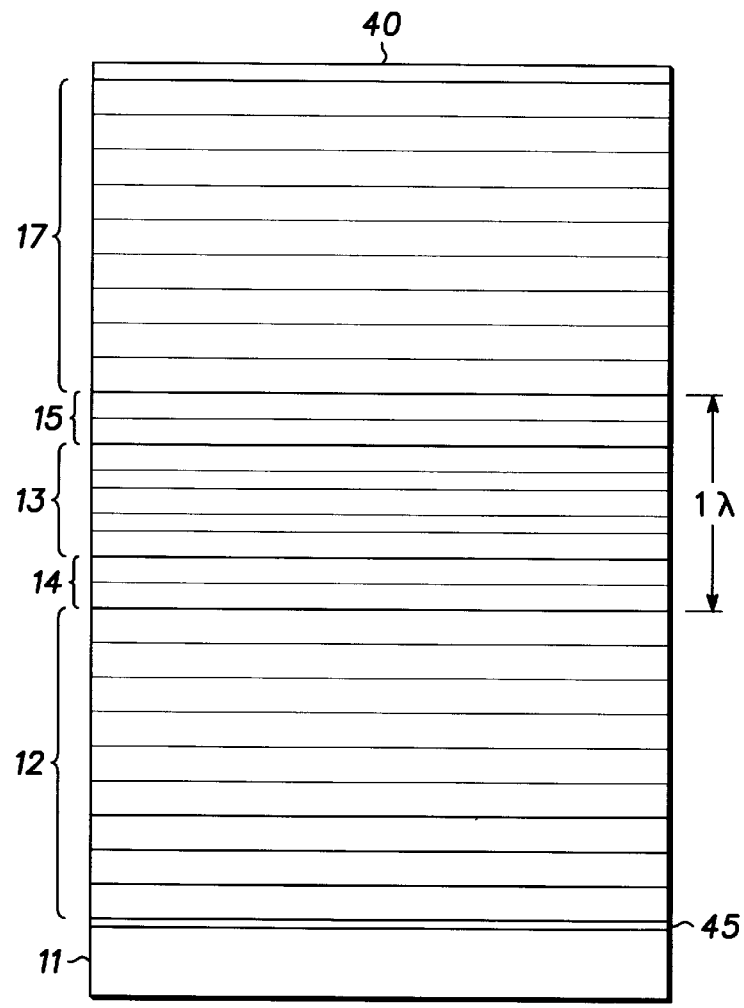
FIG. 1 is a simplified sectional view of a VCSEL constructed in accordance with the present invention.

Turning now to the drawings in which like reference characters indicate corresponding elements throughout the several views, attention is first directed to FIG. 1 which is a simplified sectional view of a vertical cavity surface emitting laser (VCSEL) generally designated 10. VCSEL 10 includes a first mirror stack 12 formed, for example, by epitaxially growing a plurality of layers of semiconductor material with alternating indexes of refraction on a substrate 11. An example of materials that can be used for this purpose is alternating layers of $Al_{0.15}$ GaAs and $Al_{0.80}$ GaAs. Each pair of alternating layers are grown to a thickness of one quarter of the emission wavelength propagating in the layers, and the number of pairs is chosen to provide as much reflectivity of light as possible while limiting the stack to a practical number.

An active region 13 is sandwiched between a first confining layer or region 14 and a second confining layer or region 15. Confining region 14 is positioned on first mirror stack 12, and a second mirror stack 17 is formed on an upper surface of confining region 15. Second mirror stack 17 is, for example formed by epitaxially growing pairs of semiconductor layers as described in conjunction with mirror stack 12. Generally, the pairs of layers will be formed of materials similar to those of mirror stack 12 and the thicknesses will be similar to provide the proper reflectivity of a selected wavelength or spectrum of wavelengths. Also, first and second mirror stacks 12 and 17 are doped with opposite conductivity types to form a two terminal (diode) structure for the flow of electrical current therethrough. In this specific embodiment, for example, mirror stack 12 is doped for n-type conductivity and mirror stack 17 is doped for p-type conductivity.

Active region 13 generally includes one or more active layers also commonly referred to as quantum wells, separated by barrier layers with confining regions 14 and 15 on either side thereof. The active layers, barrier layers, and confinement layers are also grown epitaxially. The active layers produce photons (light) in accordance with a well known phenomenon when properly energized by electrical current applied thereacross. In general, the greater the current applied to active region 13 the greater the number of photons generated. The photons are reflected by mirror stacks 12 and 17 and produce the well known lasing effect that ultimately produces the emitted light. The wavelength of the light is determined by the materials utilized in the active layer or layers of active region 13, the thickness of the alternating pairs of layers in mirror stacks 12 and 17, and the cavity length determined by regions 13, 14 and 15.

Figure 2:
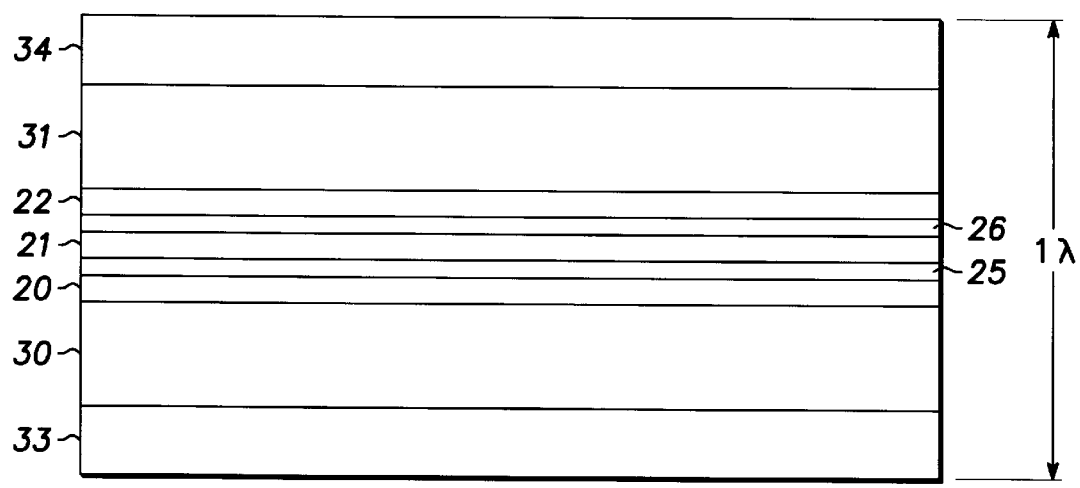
FIG. 2 is an enlarged sectional view of a potion of the structure of FIG. 1.

With additional reference to FIG. 2, active region 13 is sandwiched between confining layers 14 and 15. In this specific embodiment, active region 13 includes three active layers 20, 21 and 22 formed with barrier layers 25 and 26 sandwiched therebetween. Active layers 20, 21 and 22 separated by barrier layers 25 and 26 are sandwiched between spacer or guiding layers 30 and 31 which are in turn sandwiched between cladding layers 33 and 34. Generally, spacer layers 30 and 31 and cladding layers 33 and 34 are graded to provide guiding action, as described in more detail in U.S. Pat. No. 5,172,384, entitled "LOW THRESHOLD CURRENT LASER", issued Dec. 15, 1992 and included herein by reference.

Active region 13 is formed with a material system selected to provide light emissions having a long wavelength (greater than 800 nm), preferably a wavelength of approximately 850 nm. Typically, near IR VCSELs use a GaAs active layer. However, these devices tend to degrade due to dark line defects, frequently leading to device failure in the first few hundred hours of operation. It is believed that the addition of indium to the active layer plays a major role in retardation of dark line defects, greatly improving the reliability of the VCSEL. GaInAs active layer based long wavelength lasers have shown continuous wave operation in excess of 25,000 hours.

When near IR VCSELs with indium in the active layer are attempted, however, difficulties often arise. Adding indium lowers the band gap and increases the lattice constant. Addition of aluminum may be employed to counter the lowering of the band gap, but, as described previously, aluminum has a high affinity for oxygen. The inclusion of aluminum in the active layer can reduce efficiency and possibly speed the formation of dark line defects. Therefore the material system forming active layers 20, 21, and 22 does not contain aluminum.

To utilize aluminum free material in active layers 20, 21, and 22 and maintain long wavelength emissions, a $Ga_{(1-y)}In_yAs_{(1-x)}P_x$ material is incorporated. The addition of phosphorous compensates for the reduction in the band gap due to the indium. However, $Ga_{(1-y)}In_yAs_{(1-x)}P_x$ is not lattice matched to GaAs, and a tensile strain is induced. In a multiple active layer structure, in order to accommodate this strain without generation of misfit dislocations, the thickness of the GaInAsP layers is kept small. The preferred material system for active region 13 is therefore a GaInAsP/AlGaAs strained layers superlattice.

In a specific example (depending upon the desired wavelength to be used), active layers 20, 21 and 22 are formed of $Ga_{0.85}In_{0.15}As_{0.85}P_{0.15}$ (Eg=1.4 eV) each approximately 100 angstroms thick. Barrier layer 25 and 26 are formed of $GaAl_{0.30}As$ each approximately 100 angstroms thick. Active layers 20, 21 and 22 and barrier layers 25 and 26 have approximately equal and opposite lattice mismatch of approximately 0.65% with respect to GaAs substrate 11. The indium and phosphorous composition in GaInAsP is chosen so as to produce an emission wavelength in the range of 800–850 nm at room temperature, taking into account both the quantum well size and strain effects on the energy bands.

Spacer layers 30 and 31 are formed of $GaAl_{0.30}As$ and cladding layers 33 and 34 are formed of $GaAl_{0.50}As$, lattice matched to GaAs substrate 13. The total thickness of active region 13 and confining layers 14 and 15 is chosen to be one full wavelength optical thickness. To continue this example, the Bragg reflectors (first and second mirror stacks 12 and 17) are composed of one quarter wavelength alternating layers of $GaAl_{0.80}As$ and $GaAl_{0.15}As$.

Referring specifically back to FIG. 1, to complete the description of VCSEL 10, a p-type metallization 40 is formed on the exposed surface of upper mirror stack 17 by any known method. An n-type metallization 45 is formed in contact with mirror stack 12, for example on the upper surface of substrate 11, to provide another electrical contact for VCSEL 10. It will be understood that an electrical contact can be formed on the surface of substrate 11 opposite the surface on which mirror stack 12 is formed, if desired.

Thus a new and improved method of fabricating near IR VCSELs is disclosed. Because the active layers of the VCSELs are aluminum free and contain indium, the reliability and the lifespan of the VCSELs is substantially increased. Incorporation of strained layers and phosphorous enable near IR emissions to be achieved.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A near IR vertical cavity surface emitting laser comprising:
   a substrate;
   a first mirror stack of a first conductivity type positioned on the substrate, the first mirror stack being formed of a plurality of pairs of relatively high and low index of refraction layers;
   a second mirror stack of a second conductivity type, the second mirror stack being formed of a plurality of pairs of relatively high and low index of refraction layers; and
   an active region sandwiched between the first mirror stack and the second mirror stack, the active region being formed of a plurality of strained layers, alternate strained layers having equal and opposite crystallographic strain, the strained layers including an active layer being aluminum free and containing indium and phosphorous.

2. A near IR vertical cavity surface emitting laser as claimed in claim 1 wherein the active region is formed of materials which generate light at a wavelength of greater than 800 nm.

3. A near IR vertical cavity surface emitting laser as claimed in claim 2 further includes the active region sandwiched between a pair of confining layers.

4. A near IR vertical cavity surface emitting laser as claimed in claim 3 wherein the active region further includes a plurality of active layers having tensile strain and alternate barrier layers sandwiched therebetween.

5. A near IR vertical cavity surface emitting laser as claimed in claim 4 wherein the plurality of active layers are formed of GaInAsP and the barrier layers are formed of GaAlAs.

6. A near IR vertical cavity surface emitting laser as claimed in claim 5 wherein the confining layers each include a spacer layer and a cladding layer.

7. A near IR vertical cavity surface emitting laser as claimed in claim 6 wherein the spacer layers are formed of GaAlAs with Al equal to approximately 30%.

8. A near IR vertical cavity surface emitting laser as claimed in claim 7 wherein the cladding layers are formed of GaAlAs with Al equal to approximately 50%.

9. A near IR vertical cavity surface emitting laser as claimed in claim 6 wherein the active region and the confining layer are formed approximately one optical wavelength thick.

10. A near IR vertical cavity surface emitting laser as claimed in claim 5 wherein the GaInAsP quantum well layers are formed in accordance with the formula $Ga_{(1-y)}In_yAs_{(1-x)}P_x$.

11. A near IR vertical cavity surface emitting laser as claimed in claim 5 wherein the GaAlAs barrier layers contain 30% aluminum.

12. A vertical cavity surface emitting laser comprising:
    a substrate;
    a first mirror stack of a first conductivity type positioned on the substrate, the first mirror stack being formed of a plurality of pairs of relatively high and low index of refraction layers;
    a second mirror stack of a second conductivity type, the second mirror stack being formed of a plurality of pairs of relatively high and low index of refraction layers; and
    an active region sandwiched between the first mirror stack and the second mirror stack, the active region being formed of a plurality of active layers of GaInAsP having barrier layers of AlGaAs sandwiched therebetween; and
    the active region being sandwiched between a pair of confining layers.

13. A vertical cavity surface emitting laser as claimed in claim 12 wherein the GaAsP active layers are formed in accordance with the formula $Ga_{(1-y)}In_yAs_{(1-x)}P_x$.

14. A vertical cavity surface emitting laser as claimed in claim 13 wherein the confining layers each include a spacer layer and a cladding layer.

15. A vertical cavity surface emitting laser as claimed in claim 14 wherein the spacer layers are formed of GaAlAs with Al equal to approximately 30%.

16. A vertical cavity surface emitting laser as claimed in claim 15 wherein the cladding layers are formed of GaAlAs with Al equal to approximately 50%.

17. A vertical cavity surface emitting laser as claimed in claim 12 wherein the active region and the confining layer are formed approximately one optical wavelength thick.

18. A vertical cavity surface emitting laser as claimed in claim 13 wherein the active region is formed of materials which generate light at a wavelength in the range of approximately 800 nm–850 nm.

19. A method of fabricating a vertical cavity surface emitting laser comprising the steps of:
    forming a first mirror stack of a first conductivity type, the first mirror stack being formed of a plurality of pairs of relatively high and low index of refraction layers;
    forming a first confining layer on the first mirror stack;
    forming an active region on the first confining layer, the active region being formed of a plurality of strained layers, the strained layers including an active layer being aluminum free and containing indium and phosphorous, the plurality of strained layers including the active layer having a first strain and at least one barrier layer having an equal and opposite strain;
    forming a second confining layer on the active region; and
    forming a second mirror stack of a second conductivity type on the second confining layer, the second mirror stack being formed of a plurality of pairs of relatively high and low index of refraction layers.

20. A method as claimed in claim 19 wherein the step of forming the active region includes forming a plurality of active layers having tensile strain and alternate barrier layers having substantially equal compressive strain sandwiched therebetween.

21. A method as claimed in claim 20 wherein the step of forming the plurality of quantum well layers and barrier layers further includes forming the plurality of active layers of GaInAsP and the barrier layers of AlGaAs to generate light having a wavelength of greater than 800 nm.

22. A method as claimed in claim 21 wherein GaAsInP quantum well layers are formed in accordance with the formula $Ga_{(1-y)}In_yAs_{(1-x)}P_x$.

* * * * *

UNITED STATES PATENT AND TRADEMARK OFFICE
CERTIFICATE OF CORRECTION

PATENT NO. : 5,832,017
DATED : November 3, 1998
INVENTOR(S) : Jamal Ramdani et al.

It is certified that error appears in the above-identified patent and that said Letters Patent is hereby corrected as shown below:

On the Title page, please add item -- [73] Assignee: Motorola Inc., Schaumburg, IL.

Signed and Sealed this

Fifth Day of October, 1999

Attest:

Q. TODD DICKINSON

Attesting Officer   Acting Commissioner of Patents and Trademarks